Feb. 7, 1961 H. HEUER 2,971,179

MOUNTING DEVICE FOR PRINTED CIRCUIT BOARDS

Filed April 16, 1958 2 Sheets-Sheet 1

INVENTOR
HANS HEUER

BY: Toulmin & Toulmin
ATTORNEYS

MOUNTING DEVICE FOR PRINTED CIRCUIT BOARDS

Filed April 16, 1958

2 Sheets-Sheet 2

INVENTOR
HANS HEUER

BY: Toulmin & Toulmin
ATTORNEYS

United States Patent Office 2,971,179

Patented Feb. 7, 1961

2,971,179

MOUNTING DEVICE FOR PRINTED CIRCUIT BOARDS

Hans Heuer, Wilhelmshaven, Germany, assignor to Olympia Werke A.G., Wilhelmshaven, Germany Filed Apr. 16, 1958, Ser. No. 728,993

Claims priority, application Germany Nov. 7, 1957

8 Claims. (Cl. 339—17)

This invention relates to a novel multi-pole mounting device for printed circuits.

It is an object of my invention to provide a novel mounting device for printed circuit boards which is of simple construction and inexpensive to manufacture while guaranteeing, at the same time a constant, high contact pressure and a safe setting for the printed circuit board.

It is another object of my invention to provide a novel mounting device for printed circuit boards which device shows the aforesaid characteristics and permits a simple combination of several printed circuit boards from an integral block arrangement.

In the known mounting devices such as sockets or holding frames, the metallized and, therefore, electrically conductive strips of the printed circuit board are mounted in such a manner that they contact equally metallized portions of the socket which have coordinated therewith individual resilient contact pressure exerting members such as individual springs, made of a conventional material such as bronze, which springs have to be individually fastened in the socket or frame.

Frames or sockets of this type suffer from a number of disadvantages in particular when used for holding printed circuits. Thus, the conventionally used contact springs require a relatively large amount of material in view of the high contact pressures which are required when using printed circuit boards. The conventional frames therefore become unduly heavy and bulky, while it is a well known trend in this art to reduce weight and save space wherever possible.

Furthermore, the fact that the contact springs must be fastened in the mounting frame by a pressure or riveting method does not allow for a rationalized automatic manufacture of the frames, and partly annuls the advantages gained by the printing of the circuits. Finally, the contact springs to be used in conventional circuit frames or sockets must be provided with soldering lugs and the like eyes which tend to bend or break off, and the application of which requires additional work and material.

These drawbacks are avoided and the above-mentioned objects attained by the novel frame for printed circuit boards, according to my invention, which is characterized, as a main feature, by a contact-carrying plate of insulating material bearing on its surface or surfaces metal strips which are coordinated with the contact-making metal strips of the printed circuit board to be mounted in the frame, and by a separate pressure or spring plate which exerts pressure on the aforesaid contact-carrying plate, thereby urging the metal strips of the latter firmly into contact with the metallized strips of the printed circuit boards.

The metal strips of the contact-carrying plate are preferably also applied to the latter by printing.

According to another feature of my invention, the aforesaid contact-carrying plate is provided with recesses intermediate the metal strips serving for making contact with corresponding strips of the printed circuit board, and the aforesaid spring plate is of comb-like shape so that it bears down with each of its teeth on a metal strip-bearing tongue of the contact-carrying plate and urges the latter into contact with the corresponding metal strip of the printed circuit board.

My invention will be still better understood from the further description of the same in connection with the accompanying drawings in which Figure 1 illustrates in front view a conventional printed circuit board;

Figure 3:
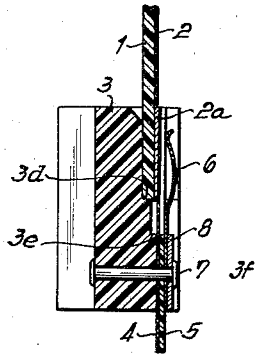
Figure 3 is a cross sectional view of Figure 2 along plane III—III in the latter figure.
Figure 4A:
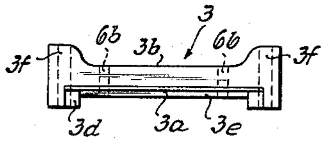
Figure 4 is a perspective view of the socket body of the mounting assembly shown in Figures 2 and 3.
Figure 5:
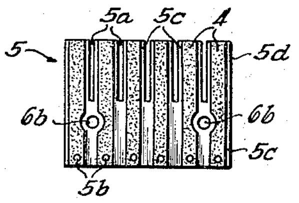
Figure 6:
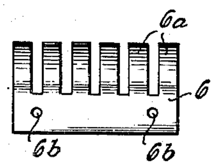
Figure 7:
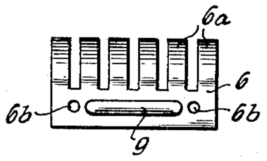
Figure 9:
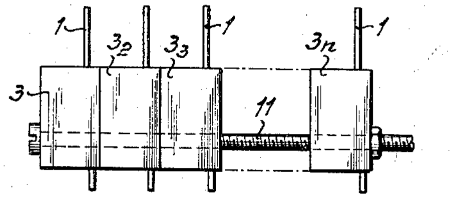
Figure 10:
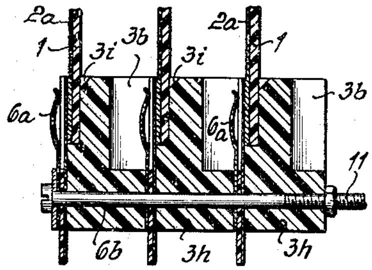
Figure 11:
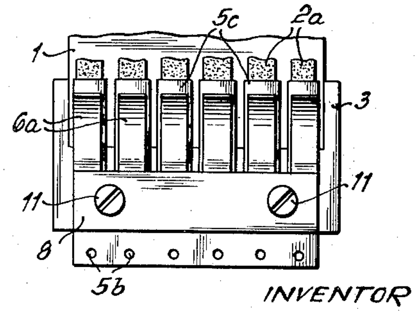
Figure 8:
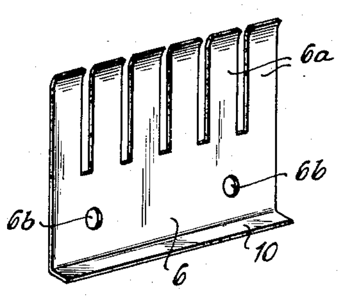
Figure 2:
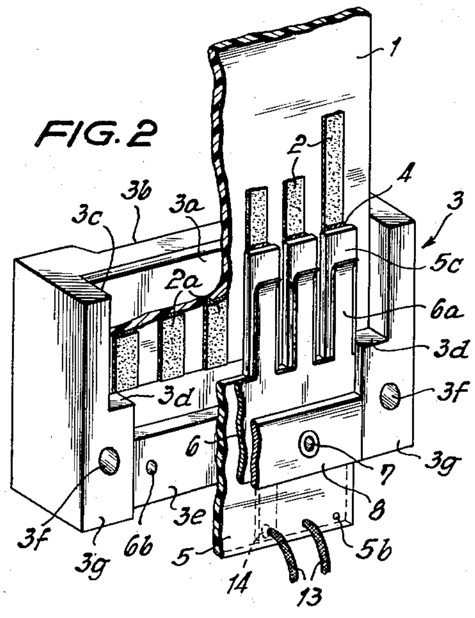
Figure 2 is a perspective partially fragmentary view of a circuit mounting device according to my invention assembled together with a printed circuit board held therein.

Figure 4*a* is a top view of the socket body;

Figure 5 is a front view of the contact plate view of the mounting device shown in Figures 2 and 3;

Figure 6 is a front view of the spring plate forming part of the mounting device shown in Figures 2 and 3;

Figure 7 shows another embodiment of the spring plate in front view;

Figure 8 shows yet another embodiment of the spring plate, in perspective view;

Figure 9 shows schematically in lateral view an assembly of several mounting devices of the type illustrated in Figures 2 and 3;

Figure 10 is a cross-sectional view, taken from the side opposite that of Figure 9, of a slightly modified assembly; and Figure 11 is a front view of the latter assembly seen from the left of Figure 10.

Figure 1:
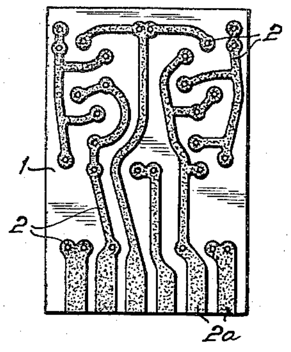

Referring now to the drawings more in detail, Figure 1 shows a printed circuit board which consists of a base plate 1 of insulating material on which there are deposited by a conventional method a number of metallized strips 2. The base plate may also carry structural elements such as tube sockets and the like which are soldered on to the plate but are not shown, since this invention is not concerned with them.

The metallized current-conducting strips 2 terminate in broadened contact strips **2*a* which are arranged at the foot edge 1*a* of base plate 1**.

Figure 4:
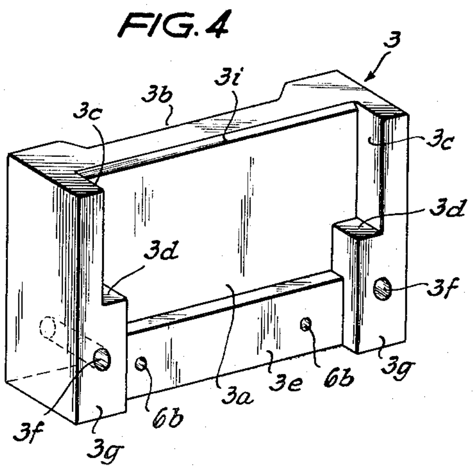

The novel mounting device shown in Figures 2 and 3 assembled together with a printed circuit board, comprises a socket or frame body 3 of insulating material (Figures 4 and 4*a*) having at its front side a recessed portion **3*a* and at its rear side another recess 3*b*. The lateral walls 3*c* of front recess 3*a* form two shoulders 3*d* on which the printed circuit board can be set as shown in Figures 2 and 3. A spacing ledge 3*e* serves for distancing a contact-carrying plate 5 from the printed circuit board. In the embodiment of the socket body 3 shown in Figure 4 the same is also provided with two bores 3*f* serving for the assembly of several sockets together, and a pair of bores 6*b* for fastening the contact-carrying plate 5 and a spring plate 6, and, if desired, an external pressure plate 8 thereon by means of fastening means 7** such as bolts and nuts, or preferably hollow rivets or any other suitable connection.

The aforesaid contact-carrying plate 5 is illustrated in Figure 5. It comprises a base plate **5*d* of insulating material which bears on its one surface metal strips 4** serving as contact-making elements co-operating with the contact portions 2a of metallized strips 2 of the printed circuit.

Between metal strips 4 the contact plate is provided with recessed slots 5a so as to form a plurality of tongues 5c. Lead-ins 13 from the outside can be connected to the conducting strips 4 by inserting their ends through bores 5b in the contact-carrying plate and soldering them on to strips 4 as at 14.

The required high contact pressure between strips 4 and strip portions 2a is brought about by means of the aforesaid spring plate 6 which is superimposed on the contact-carrying plate 5 as shown in Figures 2 and 3.

The spring plate 6, which is shown in various embodiments in Figures 6, 7 and 8, is preferably made of a highly elastic metal such as watch spring steel and the like. It is comb-shaped with the teeth 6a and may be curved in longitudinal direction so as to increase the spring effect. The curvature of the teeth 6a is shown in Figures 10 and 3. An embodiment containing a not-curved spring is shown in the Figures 2 and 8.

The provision of slots 5a and tongues 5c of the contact-carrying plate 5, each of which tongues 5c is engaged by a spring tooth 6a, avoids uneven pressure being exerted on the various contact portions 2a of the printed circuit board. Thus, if there exist slight deviations in thickness of these portions 2a, the superimposed tongue 5c and spring tooth 6a can adjust themselves individually thereto and within certain limits independently of the position of the neighboring tongues and spring teeth.

The spring plate 6 and contact-carrying plate 5 may be assembled on the socket body 3 preferably by means of a cover or pressure plate 8 of insulating material and a pair of hollow rivets or similar fastening means 7 passing through bores 6b provided in the ledge 3e of socket body 3.

Pressure plate 8, a reinforcing means, prevents an undesirable bending, buckling or warping of the spring plate in a direction transverse to that in which spring teeth 6a extend.

Pressure plate 8 may be eliminated by providing other reinforcing means such as an embossed portion or rib 9 extending transversely to the longitudinal extension of the spring teeth 6a, as shown in Figure 7, which also prevents undesirable bending or warping of spring plate 6.

The same effect may be achieved by providing the spring plate 6 at its foot edge with an angular flange 10, as shown in Figure 8.

Figures 9 and 10 illustrate the manner in which several socket bodies 3, $3^2$, $3^3$ . . . $3^n$ may be assembled by means of elongated bolts and nuts 11, the bolts being passed through bores 3f provided in socket body 3.

In Figure 10, the sockets 3 differ from that shown in Figures 2 and 3 in that the spring plate and contact-carrying plate assembly is not flush with the front walls 3g of socket body 3 but protrudes from the same, both plates being clamped in between the front ledge 3e and a rear ledge 3h, filling the lower portion of recess 3b, while the upper portion of that recess provides sufficient space for housing the curved portions of spring teeth 6a.

All intermediate pressure plates 8 can thus be eliminated and only one final pressure plate 8 is required.

The entire assembly is firmly held together by the bolt and nut connection 11 or similar suitable means passing through bores 6b.

This last-described type of arrangement allows for a somewhat narrower width of the mounting device as is shown in Figure 11, thus permitting to save still more material and space, by eliminating the wide lateral front faces 3g and the bores 3f through the latter.

The chamfered edge 3i facilitates insertion of a new printed circuit board after an old one has been removed from the assembled mounting device, without disassembling the latter.

The mounting device according to my invention has the advantage of providing a high, constant contact-carrying pressure between the tongues of the contact plate and the contacting portions 2a of the printed circuit board, while requiring a minimum of material and space. Moreover it offers protection against the penetration of dust, dirt or moisture which are excluded from reaching the interfaces between the contacting portions 2a of the printed circuit board and the metal strips 4 on the tongues 5c of the contact-carrying plates 5. Disturbances in the electrical contacts are thereby effectively prevented.

It will be understood that this invention is susceptible to modification in order to adapt it to different usages and conditions, and, accordingly, it is desired to comprehend such modifications within this invention as may fall within the scope of the appended claims.

What is claimed is:

1. A mounting device for printed circuits in which a printed circuit board having metallic contacting strips is inserted therein so that the contacting strips of the same are brought into direct contact with contact means provided on the mounting device, which device comprises a socket body of insulating material having a recessed portion, a contact-carrying plate of insulating material arranged in said recess, metallic contact strips carried on said contact-carrying plate, said plate being formed between said strips carried thereon with slots so that said plate forms a plurality of tongues on which said strips are arranged, said strips on said tongues registering with the contacting strips of the printed circuit board, respectively, when said board is inserted into said recess, resilient plate means abutting on said contact-carrying plate and comprising a spring plate having a plurality of longitudinally curved resilient spring teeth, each of which teeth exercises pressure on one of said tongues of said contact-carrying plate independently of the pressure exercised by adjacent teeth, said spring plate being connected to said socket body at only two places, and a pressure plate abutting said spring plate in the range of the latter where it is fastened to said socket body so as to stiffen said spring plate against distortion in a direction transverse to the longitudinal extension of said spring teeth.

2. A mounting device as described in claim 1, wherein said socket body is provided with two bores for receiving therein fastening means for joining several socket bodies together in series.

3. A mounting device for printed circuits in which a printed circuit board having metallic contacting strips is inserted therein so that the contacting strips of the same are brought into direct contact with contact means provided on the mounted device, which device comprises a socket body of insulating material, a contact-carrying plate of insulating material attached to said socket body, metallic contact strips carried on said contact-carrying plate, said plate being formed between said strips carried thereon with slots so that said plate forms a plurality of tongues on which said strips are arranged, said strips on said tongues registering with the contacting strips of the printed circuit board respectively when said board is attached to said socket body, resilient plate means abutting said contact-carrying plate and comprising a spring plate having a plurality of resilient spring teeth, each of which teeth exercises pressure on one of said tongues of said contact-carrying plate independently of the pressure exercised by adjacent teeth, and reinforcing means for said spring plate to stiffen said spring plate against distortion in a direction transverse to the longitudinal extension of said spring teeth.

4. A mounting device as described in claim 3, wherein said spring plate is comb-shaped, and the spring teeth are longitudinally curved.

5. A mounting device as described in claim 4, wherein said spring plate is connected to said socket body at only two places.

6. A mounting device as described in claim 5, wherein said reinforcing means comprises a pressure plate superimposed upon said spring plate in the range of the latter where it is fastened to said socket body.

7. A mounting device as described in claim 5, wherein said reinforcing means comprises an embossed portion of said spring plate in the range of the same where it is fastened to said socket body.

8. A mounting device as described in claim 3, wherein said socket body is provided with two bores for receiving therein fastening means for joining several socket bodies together in series.

References Cited in the file of this patent

UNITED STATES PATENTS

| | | |
|---|---|---|
| 2,198,704 | Lazich | Apr. 30, 1940 |
| 2,707,272 | Blitz | Apr. 26, 1955 |
| 2,825,042 | Tollefson et al. | Feb. 25, 1958 |
| 2,869,040 | Pifer | Jan. 13, 1959 |

FOREIGN PATENTS

| | | |
|---|---|---|
| 515,373 | Germany | Jan. 3, 1931 |
| 725,032 | Great Britain | Mar. 2, 1955 |